(12) United States Patent
Hack et al.

(10) Patent No.: US 7,109,591 B2
(45) Date of Patent: Sep. 19, 2006

(54) INTEGRATED CIRCUIT DEVICE

(76) Inventors: Jonathan A. Hack, 9436 SW. 32nd La., Gainesville, FL (US) 32608; Timothy M. Hsieh, 9322 Glen Rd, Potomac, MD (US) 20854

( * ) Notice: Subject to any disclaimer, the term of this patent is extended or adjusted under 35 U.S.C. 154(b) by 80 days.

(21) Appl. No.: 10/860,316

(22) Filed: Jun. 4, 2004

(65) Prior Publication Data

US 2005/0269719 A1 Dec. 8, 2005

(51) Int. Cl.
*H01L 23/29* (2006.01)
(52) U.S. Cl. ............... 257/788; 257/789; 257/790; 257/791; 257/792; 257/793; 257/794; 257/795
(58) Field of Classification Search ......... 257/788–795
See application file for complete search history.

(56) References Cited

U.S. PATENT DOCUMENTS

| | | | |
|---|---|---|---|
| 5,627,107 A | 5/1997 | Howard | 264/272.17 |
| 5,777,433 A * | 7/1998 | Lester et al. | 313/512 |
| 6,335,548 B1 * | 1/2002 | Roberts et al. | 257/98 |
| 6,507,122 B1 | 1/2003 | Blackshear | 257/787 |
| 6,518,332 B1 | 2/2003 | Asano et al. | 523/442 |
| 2004/0150268 A1 * | 8/2004 | Garito et al. | 310/12 |

* cited by examiner

*Primary Examiner*—Thien F. Tran

(57) ABSTRACT

An integrated circuit device having a semiconductor device and an encapsulating material on at least a portion of the semiconductor device and a method for encapsulating an integrated circuit device is disclosed. The encapsulating material includes a plurality of nanoparticles.

9 Claims, 2 Drawing Sheets

INTEGRATED CIRCUIT DEVICE

FIELD OF THE INVENTION

The present invention relates to encapsulation materials. More particularly, the present invention relates to encapsulation materials that include a plurality of nanoparticles.

BACKGROUND OF THE INVENTION

Integrated circuit devices are commonly encapsulated to protect them from environmental hazards such as air, moisture, chemicals, and light, and to provide the integrated circuit with greater physical strength. Useful encapsulating materials include ceramics and polymers. Generally, encapsulating polymers include, for example, epoxies. Epoxies can include epoxy resins and thermosetting epoxy resins.

Integrated circuit devices include, for example semiconductor devices used in various electronic devices and optical devices. The semiconductor device can include many integrated circuit materials such as, at least one metal region, i.e., a metal line, bonding pad, and lead frame, at least one doped region, and at least one insulator layer formed on or in a semiconductor substrate. The semiconductor substrate is sometimes called a die. Often, the semiconductor device includes a heat sink.

Heat generated during operation can cause the integrated circuit materials to expand and/or contract. The amount that each integrated circuit material expands and/or contracts can be described by the coefficient of thermal expansion ("CTE") of the particular material. And different materials have different CTE's. Composite materials, comprising one or more particular material, can expand and/or contract in volume and/or area as well. The expansion of the composite material can be described by the thermal expansion ("TE") of the composite. The CTE's of the particular materials making up the composite can be combined in various ways, depending on the composite material in question, to yield a TE for the composite. For example, in some instances the TE of the composite can be a weighted average of the CTE's of each particular material in the composite. However, in other instances the CTE's of the particular materials making up the composite combine in other ways to yield the TE for the composite.

Problems often arise in integrated circuit devices, however, when the TE of materials making up the integrated circuit differ. One problem occurs at the interface of the semiconductor device and the encapsulating material. In particular, the thermal expansion of the semiconductor device ("$TE_{SD}$") and the thermal expansion of the encapsulating material ("$TE_{EM}$") are not the same. As a result, these materials expand to different extents during operation and this can cause stress at the interface of these two materials. This stress often leads to cracking of the encapsulating material.

Accordingly, it would be useful to be able to match the $TE_{SD}$ to the $TE_{EM}$ to prevent stress and reduce the negative effects of the stress.

SUMMARY OF THE INVENTION

In an embodiment of the invention, there is an integrated circuit device having a semiconductor device and an encapsulating material on at least a portion of the semiconductor device. The encapsulating material includes a plurality of nanoparticles.

In another embodiment of the invention, there is an integrated circuit encapsulating material having an epoxy and a plurality of nanoparticles. The plurality of nanoparticles can be dispersed in the epoxy.

In another embodiment of the invention, there is a method of encapsulating an integrated circuit device. The method includes providing a semiconductor device and contacting the semiconductor device with the encapsulant material. In this embodiment, the encapsulant material includes a plurality of nanoparticles.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

In an embodiment of the invention, there is an integrated circuit device comprising a semiconductor device. The semiconductor device can include many integrated circuit materials such as metals, insulators, and semiconductors. Metal regions can be formed in or on a semiconductor substrate to form metal lines, bonding pads, interconnects, and lead frames. Certain metal regions can be used to dissipate heat generated during operation. Metals can include, for example, Ti, W, Al, Mo, Pt, Cu, Ag, Ag, and other materials known to one of skill in the art.

As mentioned, the integrated circuit materials may also include insulator layers. Insulators often form layers on or in a semiconductor substrate. Examples of insulator materials include oxides and nitrides. Additionally, examples of semiconductor substrate materials include silicon, SiGe, GaAs, AlGaAs, SiC, AlInGaP, InP, and other materials that will be well known to practitioners in the art.

The different materials used in the integrated circuit can be patterned in or on the semiconductor substrate to form useful devices. The surface of the semiconductor device may include the semiconductor material, the insulator material, and/or the metal.

Figure 1:
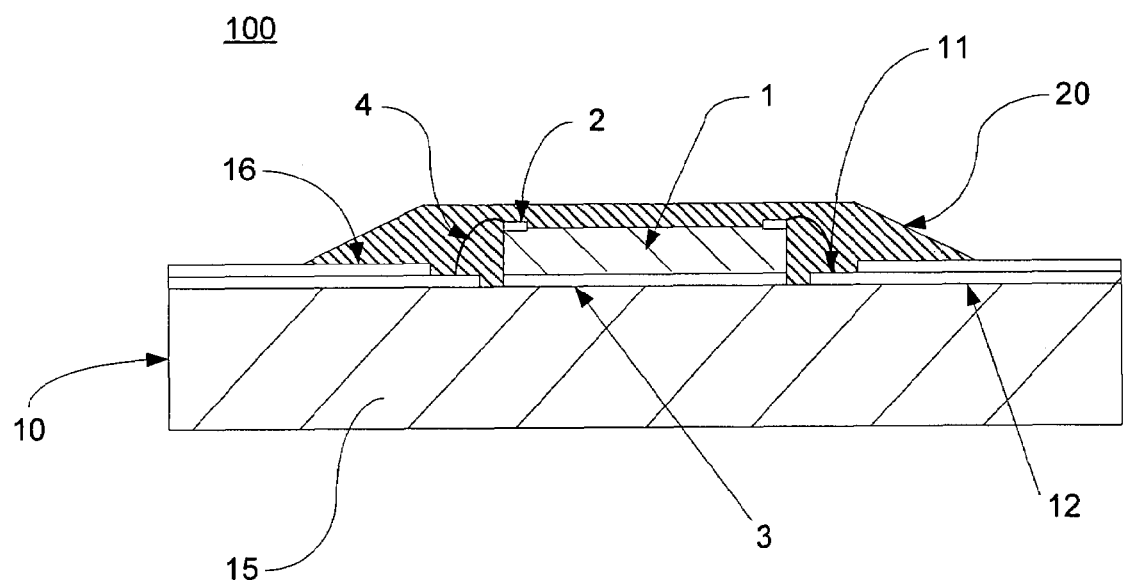
FIG. 1 depicts an exemplary semiconductor package in accordance with an embodiment of the invention.

In an embodiment of the invention, the integrated circuit device is encapsulated in an encapsulating material. As shown in FIG. 1, semiconductor package 100 comprises a semiconductor device 1 encapsulated by an encapsulating material 20. Semiconductor device 1 typically includes input/output pads 2 at an upper surface of semiconductor device 1. A lower surface of semiconductor device 1 is generally bonded to a circuit board 10 by an adhesive 3. Circuit board 10 generally includes a substrate 15, a circuit pattern 12, and bond fingers 11. Those portions of circuit pattern 12 not covered with bond fingers 11 can be coated with cover coat 16.

Encapsulating material 20 can include a ceramic material or an epoxy material. Exemplary thicknesses of the encapsulating material can be in the range of $1.0 \times 10^{-2}$ mils to 200 mils; $1.0 \times 10^{-2}$ mils to 1.0 mil; and 1 mil to 200 mils. Encapsulating material 20 can contact all, or portions of, semiconductor device 1. Encapsulating material can also encapsulate leads 4, circuit pattern 12, bond fingers 11, and cover coat 16. In certain embodiments, the leads contacting the semiconductor device may not be encapsulated.

The encapsulation material can be any resin that can be cured to form a protective layer over the semiconductor device. Suitable resins include phenolic resins, alkyds, diallyl phthalate resins, polycyanate resins, epoxy resins and the like. Among the suitable epoxy resins are those based on bisphenols such as bisphenol A; those based on biphenyl; phenol epoxy novolac resins; cresol epoxy novolac resins; those based on trisphenol methane derivatives; those based on cyclohexane or other alicyclic compounds; and the like. Bromine-substituted epoxy resins may be used to impart flame retardance to the cured resin. The resin can also be selected together with a curing agent and other additives such that upon curing it exhibits a glass transition temperature and heat distortion temperature. Suitable epoxy formulations are described, for example, in U.S. Pat. No. 5,232,970 to Solc et al., issued Aug. 3, 1993, incorporated in its entirety herein by reference.

Other epoxy resins may include for example:
(a) EOCN1020-55, an o-cresol novolac epoxy resin produced by Nippon Kayaku Co., Ltd. (epoxy equivalent, 200)
(b) YX400000HK, a biphenyl epoxy resin produced by Yuka Shell Epoxy (epoxy equivalent, 190)
(c) NC-3000P, an epoxy resin of formula (1) produced by Nippon Kayaku Co., Ltd. (epoxy equivalent, 272)
Curing Agents:
(d) DL-92, a phenolic novolac resin produced by Meiwa Kasei Industries, Ltd. (phenolic hydroxy equivalent, 110)
(e) MEH-7800SS, a phenolic aralkyl resin produced by Meiwa Kasei Industries, Ltd. (phenolic hydroxy equivalent, 175)
(f) MEH-7851 L, a phenolic resin of formula (2) produced by Meiwa Kasei Industries, Ltd. (phenolic hydroxy equivalent, 199).

In an embodiment of the present invention, the encapsulation material may further comprise a plurality of nanoparticles. The nanoparticles have a coefficient of thermal expansion, positive or negative. In various embodiments, the nanoparticles can have a coefficient of thermal expansion similar to that of the bulk material that make-up the nanoparticles. Nanoparticles are added to the encapsulation material to adjust $TE_{EM}$.

Exemplary nanoparticle materials having a positive TE include single elements, such as the Group IV elements, metals or the rare earth elements. Other nanoparticle materials having a positive TE include nitrides, oxides, phosphides, carbides, sulfides, or selenides, or combinations thereof. In certain embodiments, the nanoparticle materials can be metal oxides including titanium dioxide ($TiO_2$), magnesium oxide (MgO), yttria (YtO), zirconia ($ZrO_2$), CeOx, alumina ($Al_2O_3$), lead oxide (PbOx), silica, $SiO_2$, SiON, or composites of these oxides. In other embodiments, the materials can be made from III-V compounds or II-VI compounds. The nanoparticle materials can also include zinc selenide (ZnSe), zinc sulfide (ZnS), and alloys made from Zn, Se, S, Si, Fe, C, B, BN, and Te. Further, the nanoparticle materials can be gallium nitride (GaN), AlGaN, silicon nitride ($Si_3N_4$), SiN, or aluminum nitride. The material of the nanoparticles can also be metallic elements, such as, for example, Ag, Al, Au, Co, Cu, Fe, Mo, Ni, and W, and alloys thereof. The material of the nanoparticles can also be non-metallic elements. Exemplary non-metallic elements include, for example, Si and C, in any of their various forms (e.g., diamond, graphite, nanofibers, and single and multi-walled nanotubes). Other types of nanotubes can also be used.

Exemplary nanoparticle materials having a negative TE include, for example, Ni—Ti alloys, $ZrW_2O_8$, $ZrMo_2O_8$, $Y(WO_4)_3$, V doped $ZrP_2O_7$, $ZrV_2O_7$, ZnW, $NaTi_2$, $(Zr_2O)(PO_4)_2$, $Th_4(PO_4)_4P_2O_7$, and $AOMO_4$, where A=Nb or Ta, and M=P, As, or V. When nanoparticles having a negative TE are combined with a matrix material having a positive TE, the resulting composite material may include little or no expansion or contraction even when cycled through various thermal environments. The TE of the resulting composite material can be controlled to an extent by the doping level of the nanocomposite within the matrix material.

In certain embodiments of the present invention, the TE of the materials making up the nanoparticles is less than $TE_{EM}$. Combining the nanoparticles with the encapsulation material, which can form a composite, reduces the overall TE of the composite. Additionally, by adding various amounts of nanoparticles having a negative TE and/or adding various amounts of nanoparticles having a positive TE to the encapsulation material, $TE_{EM}$ can be adjusted to closely match $TE_{SD}$. The nanoparticles reduce or eliminate stress and other detrimental effects of TE mismatch.

The nanoparticles can also be dispersed throughout the encapsulation material so that the $TE_{EM}$ is globally affected, making the $TE_{EM}$ uniform throughout. Further, because of the small size of the nanoparticles, stress does not arise within the encapsulation material. In an embodiment of the invention, $TE_{EM}$ can be adjusted to be within 20%, 10%, 5%, 1%, or less than 1% of $TE_{SD}$.

The nanoparticles used in the embodiments described herein can be substantially spherical. Alternatively, the shape of the nanoparticles can be non-spherical. For example, the shape of the nanoparticles can be faceted or they can assume geometrical shapes such as cubes, pyramids, triangles, trapezoids, parallelograms, hexagons, tubes, or they can have no defined shape. Moreover, the nanoparticles used in the embodiments described herein do not need to have the same shape.

The nanoparticles used in the embodiments described herein can be of various sizes. For example, the average size of the nanoparticles can be less than about each of the following: 90 nm, 75 nm, 50 nm, 25 nm, 15 nm, 10 nm, 5 nm, 2 nm, 1 nm, or less than 1 nm.

In certain embodiments, nanoparticles are included into the material making up the encapsulation material at a wt % of less than 50 wt % of the composites described herein. Alternatively, nanoparticles are included into the materials making up the encapsulation material at a wt % of less than 70 wt % of the composites described herein.

In some embodiments, the nanoparticles are not in physical contact with each other in a host material and are prevented from agglomerating. Agglomeration is understood to be when two or more nanoparticles come into physical contact. When any of the nanoparticles are in physical contact with another nanoparticle, the two or more nanoparticles essentially become a single nanoparticle having a size of the combined two or more nanoparticles.

Figure 2A:
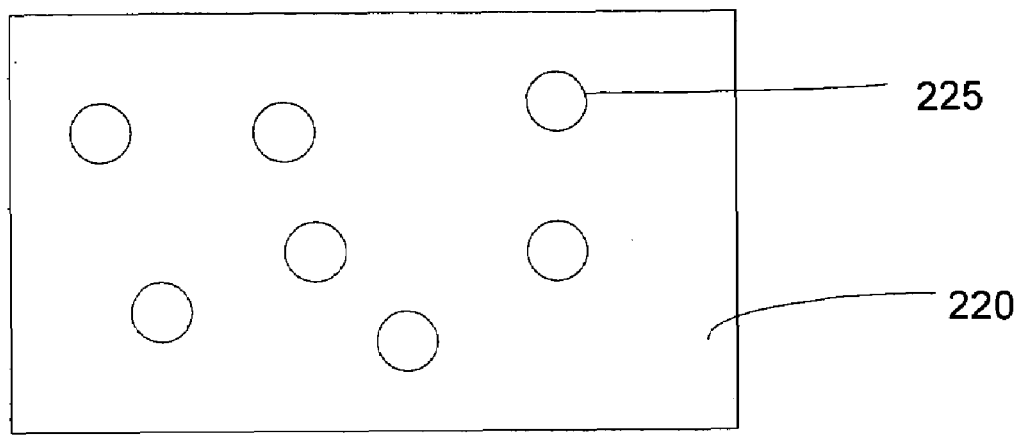
FIG. 2A depicts an exemplary section of an encapsulation material including a plurality of nanoparticles.

In certain embodiments, the nanoparticles are separated from each other by the host material. For example, FIG. 2A shows an exemplary section 200 of an encapsulation material 220. As seen in FIG. 2A, encapsulation material 220 includes a plurality of nanoparticles 225. In the exemplary section 200, nanoparticles 225 are separated by encapsulation material 220.

Figure 2B:
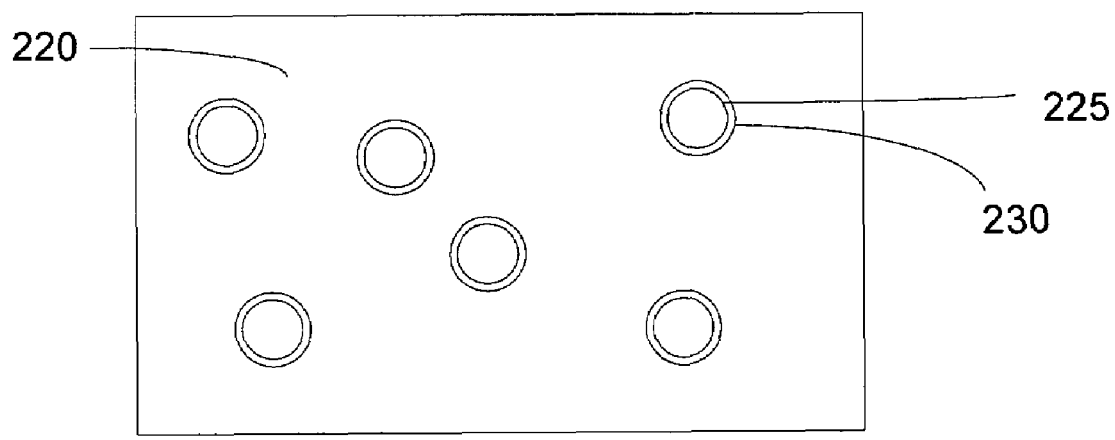
FIG. 2B depicts another exemplary section of an encapsulation material including a plurality of coated nanoparticles.

In other embodiments, the nanoparticles are prevented from agglomerating by coating the nanoparticles with a coating. As shown in FIG. 2B, there is an exemplary section 200 of encapsulation material 220. As seen in FIG. 2B the encapsulation material 220 includes a plurality of nanoparticles 225 coated with a coating 230. The coating prevents the nanoparticles from agglomerating or flocking together. In an embodiment, the anti-agglomeration coating is a surfactant organic coating. Alternatively, the anti-agglomurant can be any other known organic coating with anti-agglomurant properties.

The integrated circuit device may be encapsulated by a resin transfer molding process. In this process, a powder or palletized, normally solid uncured resin formulation is heated to a temperature at which it will flow under pressure, and then transferred under pressure to a mold cavity which contains the integrated circuit device. Powders or pellets may contain the nanoparticles or the nanoparticles may be combined with the powder or pellets with heating.

An alternative method is to inject a liquid resin formulation into a mold via an autodispensing process. In this process, the resin, curing agent, nanoparticles and other components are formulated so as to be flowable at room temperature (about 25 degrees C.). This flowable mixture is then injected into a mold cavity containing the integrated circuit device, where it is cured via the application of heat. In this method, the resin formulation can be prepared and frozen in a syringe. While frozen, the resin does not cure. This enables the resin to be transported and thawed at the time of use.

Other liquid thermosetting resin formulations may also be used, such as the "Blop-Top" encapsulants and other liquid epoxy systems as are used as underfills in flip chip bonding. These resin formulations, when filled with nanoparticles can also be used as die attach adhesives.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device comprising:
a semiconductor device;
an encapsulant material encapsulating at least a portion of the semiconductor device, the encapsulant material comprising a plurality of nanoparticles, wherein the plurality of nanoparticles comprise a material selected from at least one of materials having a positive coefficient of thermal expansion and materials having a negative coefficient of thermal expansion, and wherein the content of nanoparticles in the encapsulant material is between about $1 \times 10^{-4}$ and $5 \times 10^{1}$ parts per weight.

2. An integrated circuit device according to claim 1, wherein the plurality of nanoparticles are coated with an anti-agglomurant.

3. An integrated circuit device according to claim 1, wherein a mean particle diameter of the plurality of nanoparticles is from about 1 to 90 nm.

4. An integrated circuit device according to claim 1, wherein the plurality of nanoparticles are selected from oxides, nitrides, and sulfides.

5. An integrated circuit device according to claim 1, wherein the thermal expansion of the encapsulant is within ±20% of the thermal expansion of the surface of the semiconductor device.

6. An integrated circuit device according to claim 1, wherein the plurality of nanoparticles comprise a material having a positive coefficient of thermal expansion.

7. An integrated circuit device according to claim 6, wherein the plurality of nanoparticles are selected from at least one of titanium dioxide ($TiO_2$), magnesium oxide (MgO), yttria (YtO), zirconia ($ZrO_2$), silicon oxide ($SiO_x$), $CeO_x$, alumina ($Al_2O_3$), lead oxide ($PbO_x$), carbon nanotubes, a composite of yttria and zirconia, gallium nitride (GaN), silicon nitride, aluminum nitride, zinc selenide (ZnSe), zinc sulfide (ZnS), an alloy comprising Zn, Se, S, and Te (Tellurium), nanofibers, single and multi-walled nanotubes.

8. An integrated circuit device according to claim 1, wherein the plurality of nanoparticles comprise a material having a negative coefficient of thermal expansion.

9. An integrated circuit device according to claim 8, wherein the plurality of nanoparticles are selected from at least one of Ni—Ti alloys, $ZrW_2O_8$, $ZrMo_2O_8$, $Y(WO_4)_3$, V doped $ZrP_2O_7$, $ZrV_2O_7$, $(Zr_2O)(PO_4)_2$, ZnW, $NaTi_2$, $Th_4(PO_4)_4P_2O_7$, and $AOMO_4$, where A=Nb or Ta, and M=P, As, or V.

* * * * *